(12) United States Patent
Chang et al.

(10) Patent No.: US 7,397,047 B2
(45) Date of Patent: Jul. 8, 2008

(54) TECHNIQUE FOR TUNING AN ION IMPLANTER SYSTEM

(75) Inventors: Shengwu Chang, South Hamilton, MA (US); Joseph C. Olson, Beverly, MA (US); Damian Brennan, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 167 days.

(21) Appl. No.: 11/123,082

(22) Filed: May 6, 2005

(65) Prior Publication Data

US 2006/0249696 A1 Nov. 9, 2006

(51) Int. Cl.
*H01J 37/302* (2006.01)
(52) U.S. Cl. .............. 250/492.21; 250/492.22; 250/492.2; 438/10
(58) Field of Classification Search .............. 250/491.1, 250/492.21, 492.22, 492.2; 438/10
See application file for complete search history.

(56) References Cited

U.S. PATENT DOCUMENTS

| | | | | |
|---|---|---|---|---|
| 5,993,050 A | * | 11/1999 | Miura | 703/2 |
| 6,242,747 B1 | * | 6/2001 | Sugitani et al. | 250/396 R |
| 6,403,972 B1 | | 6/2002 | Cucchetti et al. | |
| 6,774,378 B1 | * | 8/2004 | Huang et al. | 250/492.21 |
| 2003/0042427 A1 | * | 3/2003 | Sullivan et al. | 250/397 |
| 2004/0022694 A1 | * | 2/2004 | Hara et al. | 422/112 |
| 2004/0102857 A1 | * | 5/2004 | Markle et al. | 700/2 |
| 2004/0262532 A1 | | 12/2004 | Krueger | |
| 2004/0262533 A1 | | 12/2004 | Krueger | |
| 2005/0092939 A1 | * | 5/2005 | Coss et al. | 250/492.21 |
| 2006/0088655 A1 | * | 4/2006 | Collins et al. | 427/8 |

OTHER PUBLICATIONS

Marvin R. LaFontaine, Paul J. Murphy, Edward Bell and David Holbrook, "Beam Optics of the VIISta 3000 Ion Implanter".

* cited by examiner

*Primary Examiner*—Jack I. Berman
*Assistant Examiner*—Michael J Logie

(57) ABSTRACT

A technique for tuning an ion implanter system is disclosed. In one particular exemplary embodiment, the technique may be realized as a method for tuning an ion implanter system having multiple beam-line elements. The method may comprise establishing one or more relationships among the multiple beam-line elements. The method may also comprise adjusting the multiple beam-line elements in a coordinated manner, based at least in part on the one or more established relationships, to produce a desired beam output.

25 Claims, 4 Drawing Sheets

TECHNIQUE FOR TUNING AN ION IMPLANTER SYSTEM

FIELD OF THE DISCLOSURE

The present disclosure relates generally to semiconductor equipment and, more particularly, to a technique for tuning an ion implanter system.

BACKGROUND OF THE DISCLOSURE

Ion implantation is a process of depositing chemical species into a substrate by direct bombardment of the substrate with high-energy ions. In semiconductor fabrication, ion implanters are used primarily for doping processes that alter the type and level of conductivity of target materials. A precise doping profile in an integrated circuit (IC) substrate and its thin-film structure is often crucial for the IC performance. To achieve a desired doping profile, one or more ion species may be implanted in different doses and at different energy levels. A specification of the ion species, doses and energies is referred to as an ion implantation recipe.

FIG. 1 depicts a prior art ion implanter system 100. As is typical for most ion implanter systems, the system 100 is housed in a high-vacuum environment. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 118. For illustration purposes, these components are hereinafter referred to as "beam-line elements."

In semiconductor manufacturing, an ion implanter system often has to process many batches of wafers based on various recipes. For wafer batches processed with a common recipe, it is critical that the ion implanter system maintain a consistent ion beam output. Thus, at the beginning of each batch, it is necessary to tune the ion implanter system to reproduce an ion beam that is substantially the same as produced in the past batches with the same recipe.

However, due to a number of deficiencies, existing methods for tuning an ion implanter system often fail to achieve a consistent ion beam output in an efficient manner. For example, to repeat a previously successful ion beam setup, it is typical for existing tuning methods to rely on a single set of beam-line element settings recorded in the previously successful setup. Yet, many factors in the ion implanter system can change the ion beam condition even if the beam-line element settings are maintained the same. For instance, an ion source usually has a lifetime during which the ion generation gradually degrades. Therefore, even with identical beam-line element settings, the ion beam current can be quite different depending on the length of time the ion source has been in use. Since the previously recorded single set of beam-line element settings often cannot reproduce a desired ion beam condition, the ion implanter system has to be re-tuned for every wafer batch, which is quite time-consuming for reasons described below.

Existing tuning methods also tend to use ion beam current as the only criterion to optimize the ion beam. However, identical ion beam currents do not necessarily guarantee identical ion beam conditions. For example, identical ion beam currents can be produced with several different combinations of beam-line element settings. These different combinations often cause different ion beam dimensions, positions and angles. As a result, single-parameter approaches that rely solely on ion beam current can lead to inconsistent ion beam geometries. Further, due to different ion beam geometries, extra time must be spent, for each batch, on ion beam measurement, parallelism setup, uniformity setup, and implant dose control.

In existing tuning methods, the beam-line elements are usually adjusted, one at a time, to maximize the ion beam current. Since each beam-line element may have several settings, an ion implanter system with multiple beam-line elements can have numerous combinations of settings. The one-element-at-a-time approach is effectively a blind search in a vast data universe and therefore is very time-consuming. This approach also tends to ignore the correlations among the various beam-line elements. Since a small change in one beam-line element often results in a shift of an optimal point in another, the one-element-at-a-time approach can easily mistune the ion implanter system.

In view of the foregoing, it would be desirable to provide a solution for tuning an ion implanter system which overcomes the above-described inadequacies and shortcomings.

SUMMARY OF THE DISCLOSURE

A technique for tuning an ion implanter system is disclosed. In one particular exemplary embodiment, the technique may be realized as a method for tuning an ion implanter system having multiple beam-line elements. The method may comprise establishing one or more relationships among the multiple beam-line elements. The method may also comprise adjusting the multiple beam-line elements in a coordinated manner, based at least in part on the one or more established relationships, to produce a desired beam output.

In accordance with other aspects of this particular exemplary embodiment, the multiple beam-line elements may be adjusted simultaneously. The one or more relationships among the multiple beam-line elements may be established based on a theoretical ion beam optical model or an experimental ion beam optical model that is calibrated with one or more ion beam detectors.

In accordance with further aspects of this particular exemplary embodiment, the one or more relationships among the multiple beam-line elements may be recorded in a beam setup database having a plurality of entries, wherein each entry comprises a combination of settings for the multiple beam-line elements. Each combination of settings for the multiple beam-line elements may correspond to a particular ion beam output achieved in a previous setup.

In accordance with additional aspects of this particular exemplary embodiment, the method may comprise generating a tuning table having a plurality of entries selected from the beam setup database, wherein each selected entry comprises a combination of settings for the multiple beam-line elements. The method may also comprise searching, in the tuning table, for a desired combination of settings that, when applied to the multiple beam-line elements, produces a desired ion beam output. The method may further comprise doing the following if the desired combination of settings is not found: adjusting the multiple beam-elements, based on the tuning table, until a new combination of settings produces the desired ion beam output, and recording the new combination of settings in the tuning table.

In another particular exemplary embodiment, the technique may be realized by at least one signal embodied in at least one carrier wave for transmitting a computer program of instructions configured to be readable by at least one processor for instructing the at least one processor to execute a computer process for performing the method as recited above.

In yet another particular exemplary embodiment, the technique may be realized by at least one processor readable carrier for storing a computer program of instructions configured to be readable by at least one processor for instructing the at least one processor to execute a computer process for performing the method as recited above.

In still another particular exemplary embodiment, the technique may be realized by a system for tuning an ion implanter system having multiple beam-line elements. The system may comprise means for establishing one or more relationships among the multiple beam-line elements. The system may also comprise means for adjusting the multiple beam-line elements in a coordinated manner, based at least in part on the one or more established relationships, to produce a desired beam output.

In a further particular exemplary embodiment, the technique may be realized by a system for tuning an ion implanter system having multiple beam-line elements. The system may comprise a processor, a storage device, a beam tuning controller, and a measurement interface, wherein: the storage device stores data associated with one or more relationships among the multiple beam-line elements, the processor causes the beam tuning controller to adjust the multiple beam-line elements in a coordinated manner based at least in part on the one or more relationships, and the processor determines, via the measurement interface, whether a desired ion beam output is achieved with the adjustment.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure are directed to a technique for tuning an ion implanter system having multiple beam-line elements. An improved tuning method is introduced to adjust the multiple beam-line elements in a coordinated manner based on a tuning table and/or an optic model. The tuning table may be implemented with a self-learning function that keeps accumulating ion beam setup data to improve the tuning efficiency. The optic model may provide predictive control for the tuning process in order to expedite a search for desired ion beam conditions. Furthermore, embodiments of the improved tuning method typically rely on multiple parameters as criteria or for guidance in tuning the ion beam, thereby ensuring a more consistent ion beam output than the prior art single-parameter approach.

Figure 1:
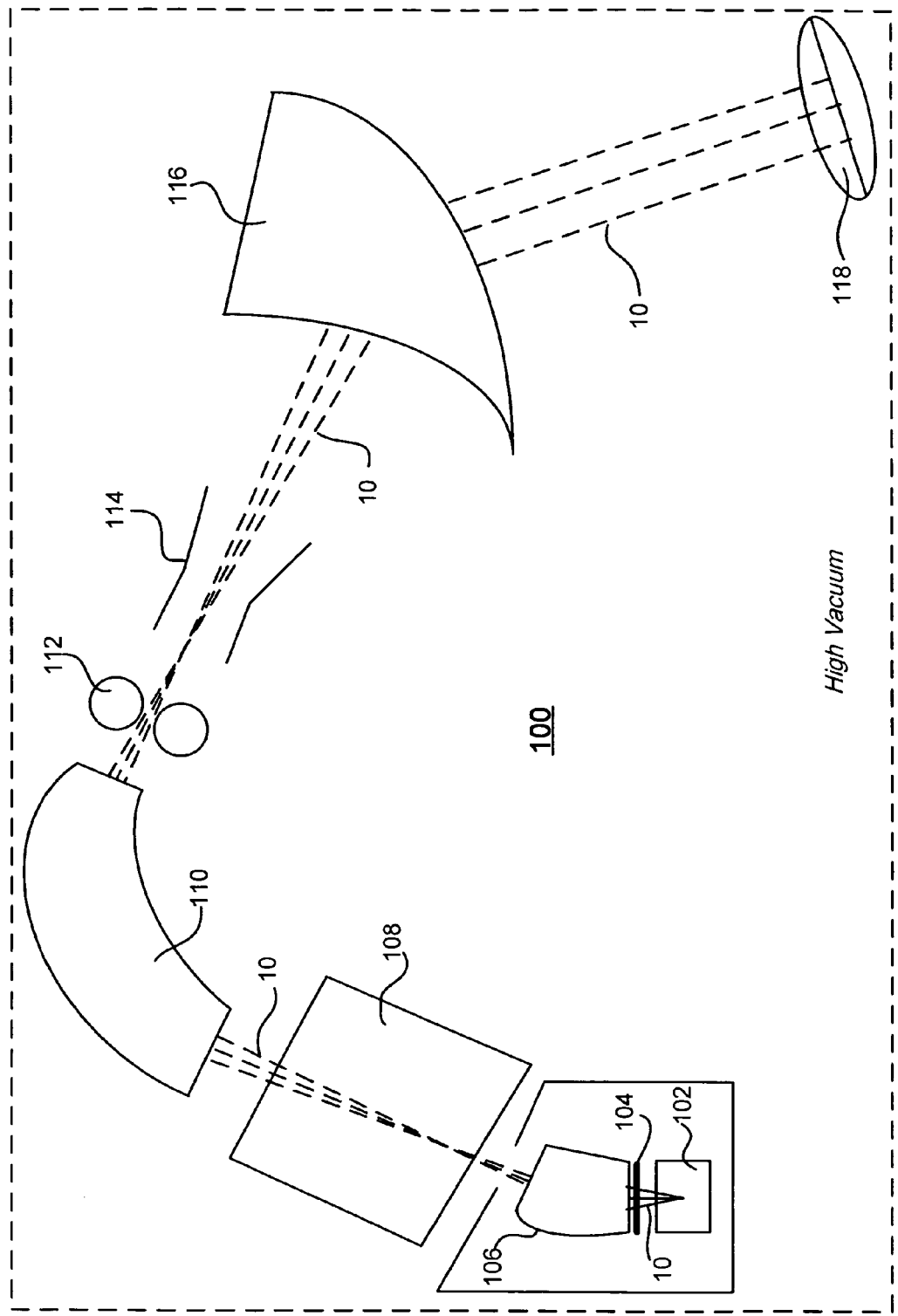
FIG. 1 is a diagram illustrating a prior art ion implanter system.
Figure 2:
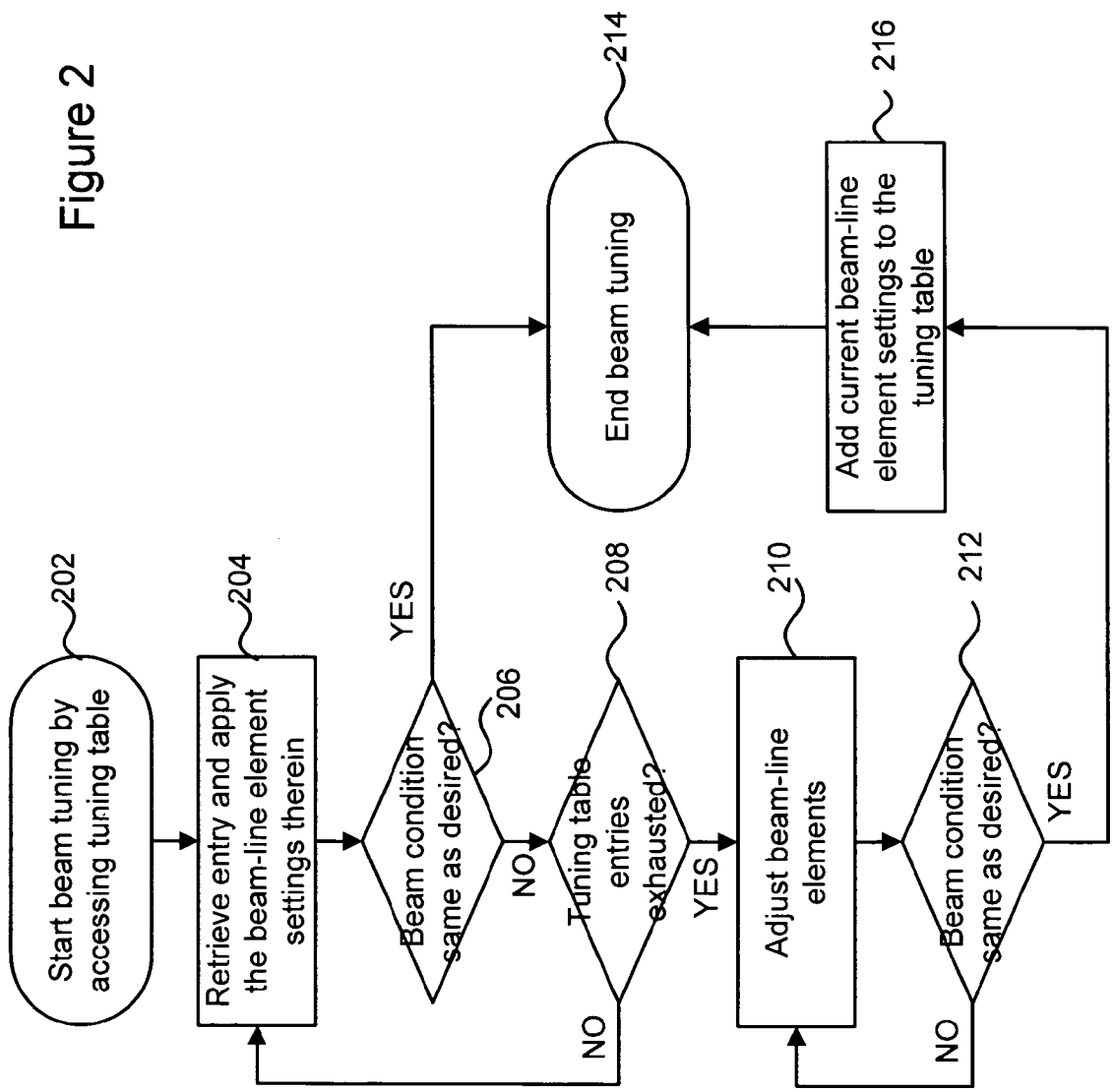
FIG. 2 is a flow chart illustrating an exemplary method for tuning an ion implanter system in accordance with an embodiment of the present disclosure.

Referring to FIG. 2, there is shown a flow chart illustrating an exemplary method for tuning an ion implanter system in accordance with an embodiment of the present disclosure. The ion implanter system may comprise multiple beam-line elements.

In step 202, a tuning table may be accessed. The tuning table may have a number of entries, wherein each entry may include a combination of settings for the multiple beam-line elements as applied in a successful beam setup in the past. The same entry may also record other data that are associated with the combination of settings. These other data may include data for effect variables and data for cause variables. An effect variable may be a parameter that typically changes in response to a change in the beam-line element settings. The effect variables may include but are not limited to ion source arc current, ion source bias current, extraction suppression current, acceleration or deceleration current, focus electrode current, electrostatic lens current; post-scan suppression electrode current, setup cup beam current, spot ion beam current, spot ion beam center position, spot ion beam size, and estimated implant current. A cause variable may be a parameter that typically causes changes in the effect variables even if the beam-line element settings are kept unchanged. The cause variables may include, for example, system environmental variables (e.g., vacuum pressure) and time-variables, such as ion source lifetime, extraction manipulator lifetime, and acceleration column lifetime. According to one embodiment of the present disclosure, the beam-line element settings and the corresponding data in each entry may be recorded based on a previously successful beam setup. Each entry may be compiled by receiving input data from various sources such as a recipe generator, a beam setup report, and an ion implant report. Over time, a large number of beam setup data may be collected and organized in a beam setup database. The tuning table may also comprise entries selected from the beam setup database based on a desired ion beam output (e.g., ion beam energy, ion beam species, ion charge state, ion beam spot center position, ion beam spot size, spot ion beam current, and implant current) and/or current beam-line conditions (e.g., vacuum pressure, ion source lifetime, extraction manipulator lifetime, and acceleration column lifetime). These data entries may include different beam-line element settings and may be used to guide the tuning process for the ion implanter system.

In step 204, an entry may be retrieved from the tuning table and the beam-line element settings therein may be applied to the multiple beam-line elements in the ion implanter system. That is, the beam-line elements are adjusted to the same status as in the past beam setup from which the entry was recorded.

In step 206, it may be determined whether the resulting ion beam condition is the same as desired. A number of parameters indicative of the ion beam condition may be measured. According to one embodiment, the ion beam current, the beam width, the beam spot center position, and the beam angle may be monitored and used as a primary set of criteria for tuning the ion beam.

If the ion beam condition is the same as desired, the beam tuning process may end in step 214. Otherwise, it may be determined, in step 208, whether the tuning table entries have been exhausted. If not, steps 204 and 206 may be repeated to try the next combination of beam-line element settings. According to embodiments of the present disclosure, the more entries there are in the tuning table, the more likely one particular combination of beam-line element settings will reproduce an ion beam with the desired characteristics. That is, as more and more historical beam setup data become accumulated in the tuning table, the beam tuning process will become more and more efficient.

If all the tuning table entries have been tried but the desired beam condition still cannot be achieved, then, in step 210, the beam-line elements may be adjusted to search for a new combination of settings that achieve the desired beam condition. As adjustments to the beam-line elements are made in step 210, it may be determined in step 212 whether the desired ion beam condition has been reached. If not, additional adjustments may be made in step 210.

The steps 210 and 212 may be repeated until the desired ion beam condition is achieved. The tuning process of the beam-line elements in steps 210 and 212 may be done in a number of ways. It may be a search for the desired settings based on nothing but the operator's knowledge and experience. Preferably, it may be guided by the data in the tuning table. For example, the search for the desired settings may be directed by a dynamic model developed from the tuning table. The development and application of the dynamic model will be described in more detail below.

Once it is determined in step 212 that the desired beam condition has been reached, the current beam-line element settings (i.e., a new combination of settings) that produce the desired ion beam output may be recorded in a new entry in the tuning table. The corresponding data for the effect variables and cause variables may also be recorded in the same entry. The new entry may be further added to the beam setup database. Then the exemplary tuning method may end in step 214.

It should be appreciated that, through no matter what tuning process the new combination of settings is found, addition of the new settings and the corresponding data may improve the tuning table. The tuning table may be a self-learning expert system that keeps on enhancing its knowledge base. When there are only a small number of entries in the tuning table, it may be necessary to go through steps 210 and 212 to find new combinations of beam-line element settings. When the tuning table has accumulated a large number of entries, it becomes more likely that at least one entry will include beam-line element settings that can produce the desired ion beam output. Therefore, as the number of entries in the tuning table grows, it is more likely that steps 210 through 216 will be skipped and the total amount of time needed for tuning the ion implanter system will be reduced.

Figure 3:
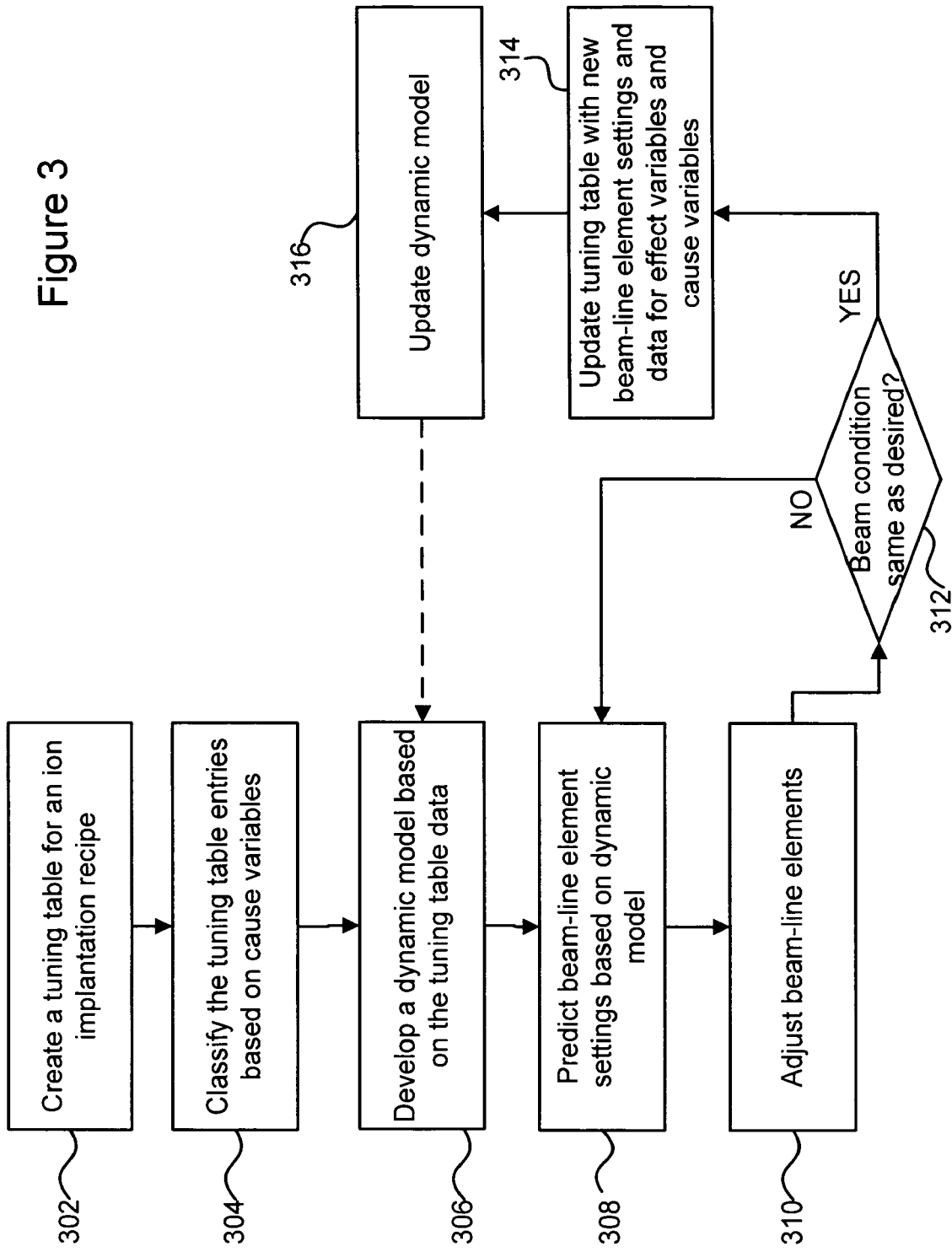
FIG. 3 is a flow chart illustrating an exemplary method for tuning an ion implanter system in accordance with an alternative embodiment of the present disclosure.

FIG. 3 is a flow chart illustrating an exemplary method for tuning an ion implanter system in accordance with an alternative embodiment of the present disclosure.

In step 302, a tuning table may be created for an ion implantation recipe. As described above, the tuning table may include a plurality of entries based on past ion beam setup data. Each entry may comprise a particular combination of beam-line element settings as well as corresponding data for effect variables and cause variables.

In step 304, the tuning table entries may be classified based on the cause variables such as time variables and environmental variables, where the effect variables in each entry may be arranged in the order of beam-line element sequence. For example, the ion source lifetime may be one of the major time variables that contribute to the ever-changing ion beam conditions. It may be beneficial to classify the tuning table entries according to how long the ion source has been in use. At a particular stage of the ion source lifetime, a combination of beam-line element settings that used to produce a desired ion beam output at a same or similar stage is more likely to reproduce that beam output. Therefore, the ion source lifetime data may provide guidance to expedite the search for a desired combination of beam-line element settings.

According to one embodiment, the ion source lifetime data may be utilized in the following steps. First, the beam setup database may be searched for all the sets of beam setup data having the same ion source lifetime and the desired beam output (ion beam energy, ion beam species, ion charge state, ion beam spot center position, ion beam spot size, spot ion beam current, implant current). Next, all the selected sets of beam setup data may be arranged in reverse chronological order as these beam setup data were generated to create a beam tuning table wherein each entry may include a set of beam setup data or a combination of settings for the multiple beam-line elements as applied in a successful beam setup in the past. Then, each entry of the beam tuning table may be sequentially applied to the multiple beam-line elements to determine the combination of settings which produce a desired beam output. If the desired beam output still cannot be achieved after all the entries in the beam tuning table have been applied to the multiple beam-line elements, the following procedure may be followed: identify a combination of settings in beam tuning table which produce the closest beam output as desired; apply this combination of settings to the multiple beam-line elements; compare the resulting beam-line effect variables with the target effect variables that is registered in the beam tuning table for this combination of settings to determine which one or more beam-line elements need to be tuned; adjust above-determined beam-line element (s) to search for the new combination of settings that achieve the desired beam output. Since the ion beam is transported from the ion source to wafer through a sequence of beam-line elements, the difference between the current beam-line effect variables and the target effect variables such as ion source arc current, ion source bias current, extraction suppression current, acceleration or deceleration current, focus electrode current, acceleration suppression current, electrostatic lens current, post-scan suppression electrode current, setup cup beam current, spot ion beam current, spot ion beam center, spot ion beam size, and estimated implant current arranged in order of beam-line element sequence, may indicate which beam-line elements need adjustment in order to produce the desired beam output. For example, if there are no difference in ion source arc current, ion source bias current, extraction suppression current, acceleration or deceleration current, but there are differences in the rest of effect variables between the current beam-line effect variables and the target effect variables, the beam-line elements before the acceleration column such as a gas flow, an ion source, a source magnet, a suppression electrode, an extraction electrode, a manipulator motor, a filter magnet do not require adjustment, while the beam-line elements after the acceleration column such as an accelerator focus electrode, an accelerator suppression electrode, an analyzer magnet, a mass slit, a electrostatic lens, a horizontal scan plates, a post-scan suppression electrode, a nitrogen ($N_2$) bleed, a corrector magnet, a limiting aperture need to be tuned.

Similarly, the tuning table entries may also be classified based on the system vacuum data, the extraction manipulator lifetime data, and acceleration column data, and in each entry, the effect variables may be arranged in order of beam-line element sequence, for example.

In step 306, a dynamic model may be developed based on correlations between the beam-line element settings and the cause variables, as well as correlations between the effect variables and the cause variables.

The dynamic model may be utilized to improve the beam tuning process in a number of ways, especially when no settings can be found in the tuning table that produce the desired ion beam output. For example, in step 308, the dynamic model may be employed to predict desired beam-line element settings. Each combination of beam-line element settings in the tuning table may be an array having N elements that correspond to the N beam-line element settings. Thus, each entry in the tuning table may be considered as a geometry point in an N-dimensional space. A geometry curve may be derived mathematically to fit the plurality of geometry points (i.e., tuning table entries). This geometry curve may be called a "beam setup curve." The beam setup curve may guide the search for a desired combination of beam-line element settings. Also, employment of the dynamic model may reduce the potential combinations of beam-line element settings in tuning trials.

In step 310, the beam-line element settings predicted in step 308 may be applied to the multiple beam-line elements. Then, in step 312, it may be determined whether the desired ion beam condition has been reached. If not, the process may loop back to step 308 where further adjustments to the beam-line elements may be predicted and then applied in step 310. The steps 308-312 may be repeated until the desired beam condition has been achieved. Although broken down into separate steps, the process represented by steps 308-310 may be implemented as a continuous feedback loop and the trials of beam-line element settings may quickly converge to a new combination of settings.

Then, in step 314, the tuning table may be updated with the new combination of beam-line element settings as well as the corresponding data for effect variables and cause variables. The new data entry in the tuning table may then be used to update or refine the dynamic model in step 316.

According to embodiments of the present disclosure, use of a beam setup database and a tuning table is but one way to establish relationships among multiple beam-line elements in an ion implanter system. In place of or in addition to the above-described beam setup database or tuning table, an ion beam optic model may be developed to establish relationships among the multiple beam-line elements. For example, a theoretical optic model may be built with the following procedure: (a) determining an overall envelope of the beam-line using the OPTICIAN™ program (developed by Diamond Semiconductor Group, Inc.), which produces the height and width of the beam along the beam path; (b) calculating initial magnetic and electrostatic fields within the beam-line elements using the TOSCA™ Finite-Element program (developed by FE-Design, GmbH); and (c) tracking ions along the beam path using the ray-tracing feature of the TOSCA™ Finite-Element program. This theoretical optic model may then be referenced to coordinate the adjustments of the multiple beam-line elements. Alternatively, an experimental optic model may be developed to guide the adjustments. One or more ion beam detectors or sensors may be deployed on or near the beam path to determine a relationship between a characteristic of the ion beam and the beam-line element settings. One exemplary method employing beam current sensors is disclosed in U.S. Pat. No. 6,403,972, entitled "Method and Apparatus for Alignment of Ion Beam Systems Using Beam Current Sensors," filed Jul. 8, 1999, which is incorporated herein in its entirety.

Figure 4:
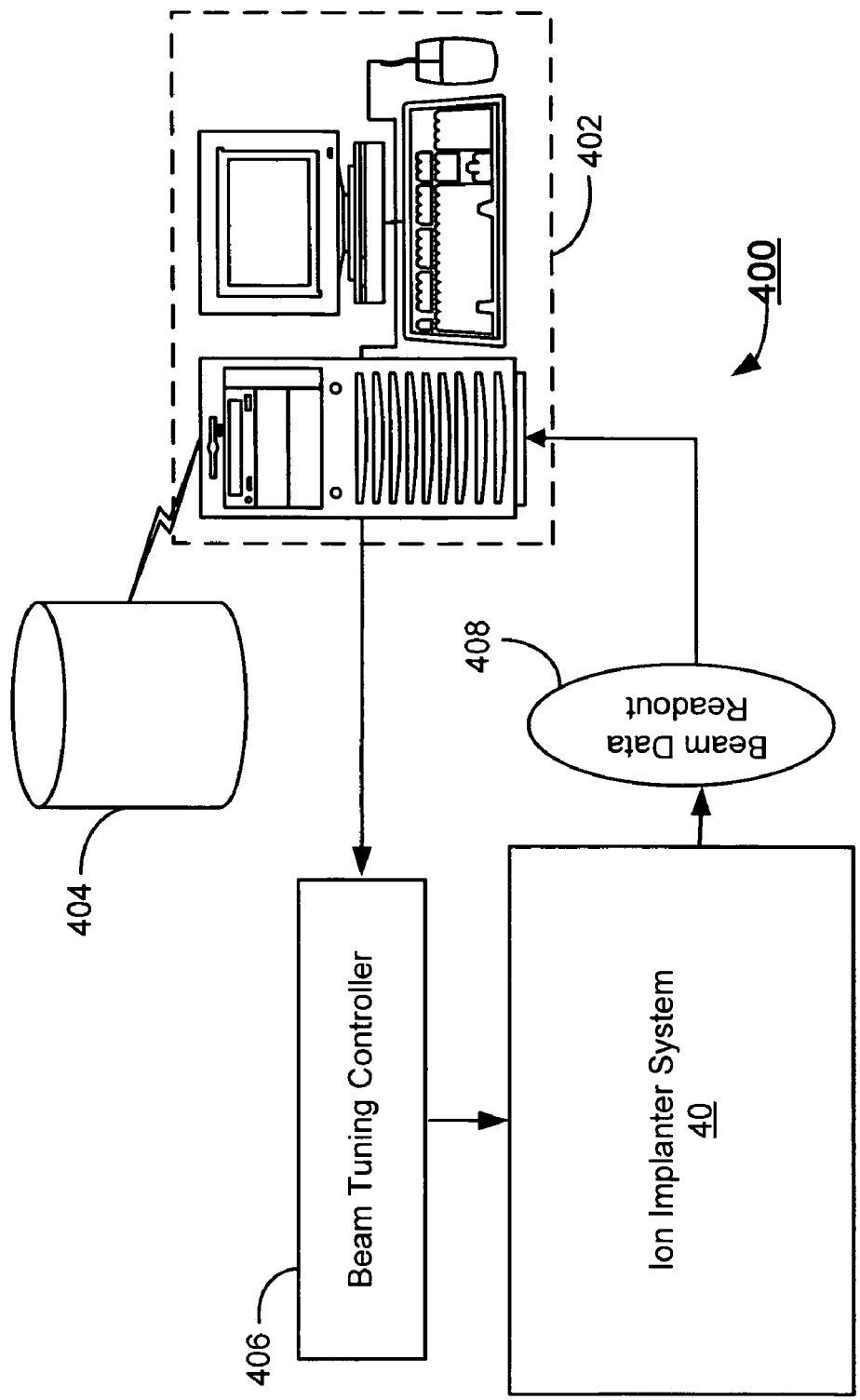
FIG. 4 is a block diagram illustrating an exemplary system for tuning an ion implanter system in accordance with an embodiment of the present disclosure.

FIG. 4 is a block diagram illustrating an exemplary system 400 for tuning an ion implanter system 40 in accordance with an embodiment of the present disclosure. The system 400 may comprise a processor unit 402 which may be a microprocessor, micro-controller, personal computer (PC) or any other processing device. The processor unit 402 may be coupled to a storage device 404 that stores one or more tuning tables. The system 400 may further comprise a beam tuning controller 406 that adjusts beam-line elements in the ion implanter system 40 according to instructions received from the processor unit 402. The system 400 may additionally comprise a beam data readout interface 408 through which the processor unit 402 may receive measurement data from the ion implanter system 40.

In operation, the processor unit 402 may retrieve a tuning table from the storage device 404. The processor unit 402 may sort the beam setup data entries in the tuning table and formulate a strategy for tuning the ion implanter system 40. Then, the processor unit 402 may instruct the beam tuning controller 406 to apply one or more combinations of beam-line element settings to the ion implanter system 40. Based on the feedback of measurement data received from the beam data readout interface 408, the processor unit 402 may determine whether a desired ion beam condition has been reached, and may revise its instructions to the beam tuning controller 408. Once the desired beam condition has been achieved, the processor unit 402 may update the tuning table with new data, if any, and return the tuning table to the storage device 404.

At this point it should be noted that the technique for tuning an ion implanter system in accordance with the present disclosure as described above typically involves the processing of input data and the generation of output data to some extent. This input data processing and output data generation may be implemented in hardware or software. For example, specific electronic components may be employed in an ion implanter system or similar or related circuitry for implementing the functions associated with ion beam tuning in accordance with the present disclosure as described above. Alternatively, one or more processors operating in accordance with stored instructions may implement the functions associated with ion beam tuning in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. A method for tuning an ion implanter system having multiple beam-line elements, the method comprising:
generating, from a beam setup database, a tuning table having a plurality of entries, wherein each entry comprises a combination of settings for the multiple beam-line elements that are likely to produce a desired beam output;
adjusting the multiple beam-line element settings in a coordinated manner by applying one or more of the plurality of entries to the multiple beam-line elements until an actual beam output within an acceptable range of the desired beam output is achieved; and
upon exhausting the plurality of the entries in the tuning table without bringing the actual beam output within the acceptable range of the desired beam output, further adjusting the multiple beam-line elements in a coordinated manner to search for a new combination of settings that produces the desired beam output, thereby accumulating an additional entry for the tuning table.

2. The method according to claim 1, wherein the settings in each entry are applied to the multiple beam-line elements at substantially the same time.

3. The method according to claim 1, wherein at least one combination of settings in the tuning table is established based on a theoretical ion beam optical model.

4. The method according to claim 1, wherein at least one combination of settings in the tuning table is established based on an experimental ion beam optical model that is calibrated with one or more ion beam detectors.

5. The method according to claim 1, wherein each combination of settings for the multiple beam-line elements in the beam setup database corresponds to a particular ion beam output achieved in a previous setup.

6. The method according to claim 1, wherein the beam setup database is created based on data from one or more of the following sources:
an ion implant recipe generator;
a mathematic model for ion implantation;
a beam setup report; and
an ion implant report.

7. The method according to claim 1, wherein each entry of the tuning table further comprises ion beam data associated with the combination of settings in the entry.

8. The method according to claim 7, wherein the ion beam data further comprise effect variable data and cause variable data.

9. The method according to claim 8, wherein the effect variable data are selected from a group consisting of:
ion source arc current;
ion source bias current;
extraction suppression current;
acceleration or deceleration current;
focus electrode current;
acceleration suppression current;
electrostatic lens current;
post-scan suppression electrode current;
setup cup beam current;
spot ion beam current;
spot ion beam center;
spot ion beam size; and
estimated implant current.

10. The method according to claim 8, wherein the cause variable data are selected from a group consisting of:
vacuum pressure;
ion source lifetime;
extraction manipulator lifetime; and
acceleration column lifetime.

11. The method according to claim 8 further comprising:
identifying, based on the effect variable data, one or more beam-line elements that require adjustment in order to produce the desired beam output.

12. The method according to claim 8, further comprising:
selecting, based on the cause variable data, the plurality of entries from the beam setup database to generate the tuning table.

13. The method according to claim 1 further comprising:
generating a dynamic model based on the tuning table; and
predicting the new combination of settings with the dynamic model.

14. The method according to claim 1, wherein the desired ion beam output is defined by one or more characteristics selected from a group consisting of:
an ion beam energy;
an ion beam species;
an ion charge state;
a spot beam center position;
a spot beam size;
a spot beam current; and
an implant current.

15. The method according to claim 1 further comprising:
treating each entry in the tuning table as a data point in a multi-dimensional space;
fitting the plurality of data points with a curve in the multi-dimensional space; and
searching, along the curve, for the desired combination of settings.

16. The method according to claim 1, wherein the multiple beam-line elements are selected from a group consisting of:
a gas flow;
an ion source;
a source magnet;
a source bias voltage;
a suppression electrode;
an extraction electrode;
a manipulator motor;
a filter magnet;
an acceleration or deceleration voltage;
an accelerator focus electrode;
an accelerator suppression electrode;
an analyzer magnet;
a mass slit;
an electrostatic lens;
a horizontal scan plates;
a post-scan suppression electrode;
a nitrogen ($N_2$) bleed;
a corrector magnet; and
a limiting aperture of the ion implanter system.

17. At least one processor readable medium for storing a computer program of instructions configured to be readable by at least one processor for instructing the at least one processor to execute a computer process for performing the method as recited in claim 1.

18. The method according to claim 1, wherein each entry comprises an effect variable data and a cause variable data, the effect variable data being associated with a parameter that changes in response to a change in the beam-line element settings and the cause variable data being associated with a parameter that changes the effect variable data even if the beam-line element settings are unchanged.

19. The method according to claim 18, wherein the plurality of entries contained in the beam setup database are classified based on the cause variable data.

20. The method according to claim 19, wherein the effect variable data in each entry is arranged in the order of the beam-line element sequence.

21. The method according to claim 1, wherein adjusting the multiple beam-line element settings in a coordinated manner by applying one or more of the plurality of entries further comprises:

arranging the plurality of entries in a reverse chronological order of dates each of the plurality of entries is created; and applying the arranged plurality of entries in sequence until the actual beam output within the acceptable range of the desired beam output is achieved.

22. The method according to claim 1, wherein each entry further comprises a first entry data associated with ion source lifetime and wherein the generating the tuning table comprises:

classifying the entries based on the first data;

arranging the entries in a reverse chronological order of the date each entry is created.

23. A system for tuning an ion implanter system having multiple beam-line elements, the system comprising:

means for generating, from a beam setup database, a tuning table having a plurality of entries, wherein each entry comprises a combination of settings for the multiple beam-line elements that are likely to produce a desired beam output;

means for adjusting the multiple beam-line element settings in a coordinated manner by applying one or more of the plurality of entries to the multiple beam-line elements until an actual beam output within an acceptable range of the desired beam output is achieved; and means for further adjusting the multiple beam-line elements in a coordinated manner to search for a new combination of settings that produces the desired beam output and adding the new combination of settings to the beam setup database in association with the desired beam output, thereby accumulating an additional entry for the tuning table.

24. The system according to claim 23 further comprising: means for establishing at least one combination of settings for the multiple beam-line elements based on an ion beam optic model.

25. A system for tuning an ion implanter system having multiple beam-line elements, the system comprising:

a processor, a storage device, a beam tuning controller, and a measurement interface, wherein the storage device stores a beam setup database that establishes one or more relationships among the multiple beam-line elements, the processor generates, from the beam setup database, a tuning table having a plurality of entries, wherein each entry comprises a combination of settings for the multiple beam-line elements that are likely to produce a desired beam output, the processor causes the beam tuning controller to adjust the multiple beam-line element settings in a coordinated manner by causing the beam tuning controller to apply one or more of the plurality of entries to the multiple beam-line elements until an actual beam output within an acceptable range of the desired beam output is detected by the measurement interface, and upon exhausting the plurality of entries in the tuning table without brining the actual beam output within the acceptable range of the desired beam output, the processor further causes the beam tuning controller to adjust the multiple beam-line elements in a coordinated manner to search for a new combination of settings that produces the desired beam output, and adding the new combination of settings to the beam setup database in association with the desired beam output, thereby accumulating an additional entry for the tuning table.

* * * * *